(12) United States Patent
Hata (10) Patent No.: US 8,150,647 B2
(45) Date of Patent: Apr. 3, 2012

(54) ELECTRIC DEVICE AND DIAGNOSTIC APPARATUS

(75) Inventor: Masahiko Hata, Saitama (JP)

(73) Assignee: Advantest Corporation, Tokyo (JP)

( * ) Notice: Subject to any disclaimer, the term of this patent is extended or adjusted under 35 U.S.C. 154(b) by 124 days.

(21) Appl. No.: 12/712,172

(22) Filed: Feb. 24, 2010

(65) Prior Publication Data

US 2010/0235125 A1    Sep. 16, 2010

Related U.S. Application Data

(63) Continuation of application No. PCT/JP2007/066534, filed on Aug. 27, 2007.

(51) Int. Cl.
*G01R 27/28* (2006.01)

(52) U.S. Cl. .......................................... 702/120

(58) Field of Classification Search .................. 702/120
See application file for complete search history.

(56) References Cited

U.S. PATENT DOCUMENTS

| | | | |
|---|---|---|---|
| 7,487,378 B2* | 2/2009 | Morein et al. ............... | 713/503 |
| 2006/0129868 A1* | 6/2006 | Matsumoto et al. .......... | 713/500 |
| 2008/0258762 A1* | 10/2008 | Koo ................................ | 326/38 |

FOREIGN PATENT DOCUMENTS

| | | |
|---|---|---|
| JP | 2-201275 A | 8/1990 |
| JP | 10-096758 A | 4/1998 |
| JP | 11-142483 A | 5/1999 |
| JP | 2001-264389 A | 9/2001 |

OTHER PUBLICATIONS

International Search Report (ISR) issued in PCT/JP2007/066534 (parent application) for Examiner consideration citing Foreign Patent Document Nos. 2-4 listed above.
Written Opinion (PCT/ISA/237) issued in PCT/2007/066534 (parent application).

* cited by examiner

*Primary Examiner* — Aditya Bhat
(74) *Attorney, Agent, or Firm* — Chen Yoshimura LLP (57) ABSTRACT

An electric device includes a plurality of circuits that operate in synchronization with a clock signal, a plurality of flip-flops each of which acquires a data value of a signal from a corresponding one of the plurality of circuits in synchronization with the clock signal and stores the acquired data value therein until receiving a next clock signal, where each flip-flop enters into a clock-disabled state, when receiving a signal at a disable terminal thereof, in which the acquired data value continues to be stored in the flip-flop, a timing controller that outputs a hold signal to the disable terminal of each flip-flop at a timing at which a corresponding circuit is desired to be diagnosed, and a plurality of diagnosis lines that are respectively provided in correspondence with the plurality of flip-flops, each diagnosis line outputting as diagnosis data a data value stored in a corresponding flip-flop.

9 Claims, 6 Drawing Sheets

ELECTRIC DEVICE AND DIAGNOSTIC APPARATUS

BACKGROUND

1. Technical Field

The present invention relates to an electric device and a diagnostic apparatus. More particularly, the present invention relates to an electric device that operates in synchronization with a clock signal and to a diagnostic apparatus that diagnoses such an electric device.

2. Related Art

A known diagnostic apparatus operates an electric device including a plurality of circuits, acquires at a given timing an output value from a target circuit selected from the plurality of circuits, and judges whether the target circuit is acceptable based on the acquired output value (for example, see Patent Document 1). Such a diagnostic apparatus stops the clock signal in the electric device at a timing at which a to-be-diagnosed circuit is desired to be diagnosed and reads a steady-state output value from the to-be diagnosed circuit while the clock signal remains suspended. The diagnostic apparatus allows the clock signal to be resumed after having read the output value.

An exemplary electric device is an LSI that operates with the GHz clock frequency. The LSI may include a timing adjusting circuit that adjusts a timing of exchanging data with a different LSI so as to satisfy an optimal margin. Such an electric device is diagnosed by a diagnostic apparatus that attempts to detect an optimal data exchange timing while sequentially changing a timing.

Patent Document 1: Japanese Patent Application Publication No. 10-096758

When a clock signal is stopped and thereafter resumed in an electric device, there is a large change in the power consumed by a clock buffer, a flip-flop, and other components of the electric device. Thus, turning on and off the clock signal in the electric device results in a large change in the power supply current, which significantly increases and decreases the power supply voltage.

As described above, when an electric device is subjected to a diagnosis process performed by a diagnostic apparatus of the type that makes a diagnosis based on an output value that is read from a to-be-diagnosed circuit of the electric device while a clock signal remains suspended from being supplied to the electric device, the power supply voltage of the electric device dramatically increases and decreases within a certain period of time, for example, several milliseconds. This dramatic change creates sudden increase and decrease in the temperature of the electric device. Thus, during the diagnosis process performed by the diagnostic apparatus of this type, the electric device operates with transient power supply voltage and temperature, which are different from normal power supply voltage and temperature observed during an actual operation. For this reason, the diagnostic apparatus cannot make a diagnosis based on stable data. The diagnostic apparatus may also read the output value from the to-be-diagnosed circuit while the clock signal remains suspended from being supplied to the electric device for another purpose of detecting a time margin for an input/output buffer or the like that enables the electric device to reliably exchange data with a different device. During such a time-margin detection process, the diagnostic apparatus also inevitably causes the electric device to operate under different conditions from when the electric device actually operates. Therefore, the diagnostic apparatus has difficulties in detecting an accurate time margin.

Furthermore, the electric device experiences a large change in the power supply load when the clock signal is suspended and thereafter resumed. Therefore, when the diagnostic apparatus successively performs a plurality of diagnosis processes on the electric devices, a period of time of approximately several milliseconds needs to be provided every time the clock signal is resumed to restore the power supply load back to a normal level.

SUMMARY

Therefore, it is an object of an aspect of the innovations herein to provide an electric device and a diagnostic apparatus which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary electric device may include a plurality of circuits that operate in synchronization with a clock signal, a plurality of flip-flops each of which acquires a data value of a signal from a corresponding one of the plurality of circuits in synchronization with the clock signal and stores the acquired data value therein until receiving a next clock signal, where each flip-flop enters into a clock-disabled state, when receiving a signal at a disable terminal thereof, in which the acquired data value continues to be stored in the flip-flop, a timing controller that outputs a hold signal to the disable terminal of each flip-flop at a timing at which a corresponding circuit is desired to be diagnosed, and a plurality of diagnosis lines that are respectively provided in correspondence with the plurality of flip-flops, each diagnosis line outputting as diagnosis data a data value stored in a corresponding flip-flop. Furthermore, a diagnostic apparatus for diagnosing such an electric device is provided.

According to the second aspect related to the innovations herein, one exemplary electric device may include a plurality of circuits that operate in synchronization with a clock signal, a plurality of flip-flops each of which acquires a data value of a signal from a corresponding one of the plurality of circuits in synchronization with the clock signal and stores the acquired data value therein until receiving a next clock signal, a plurality of mask sections that are provided in correspondence with the plurality of flip-flops, where each mask section masks the clock signal to be input into a corresponding one of the plurality of flip-flops, a timing controller that outputs a mask signal to one of the plurality of mask sections that corresponds to a circuit to be diagnosed at a timing at which the circuit is desired to be diagnosed so that the mask section masks the clock signal to be input into a flip-flop corresponding to the circuit to be diagnosed, and a plurality of diagnosis lines that are respectively provided in correspondence with the plurality of flip-flops, each diagnosis line outputting as diagnosis data a data value stored in a corresponding flip-flop. Furthermore, a diagnostic apparatus for diagnosing such an electric device is provided.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
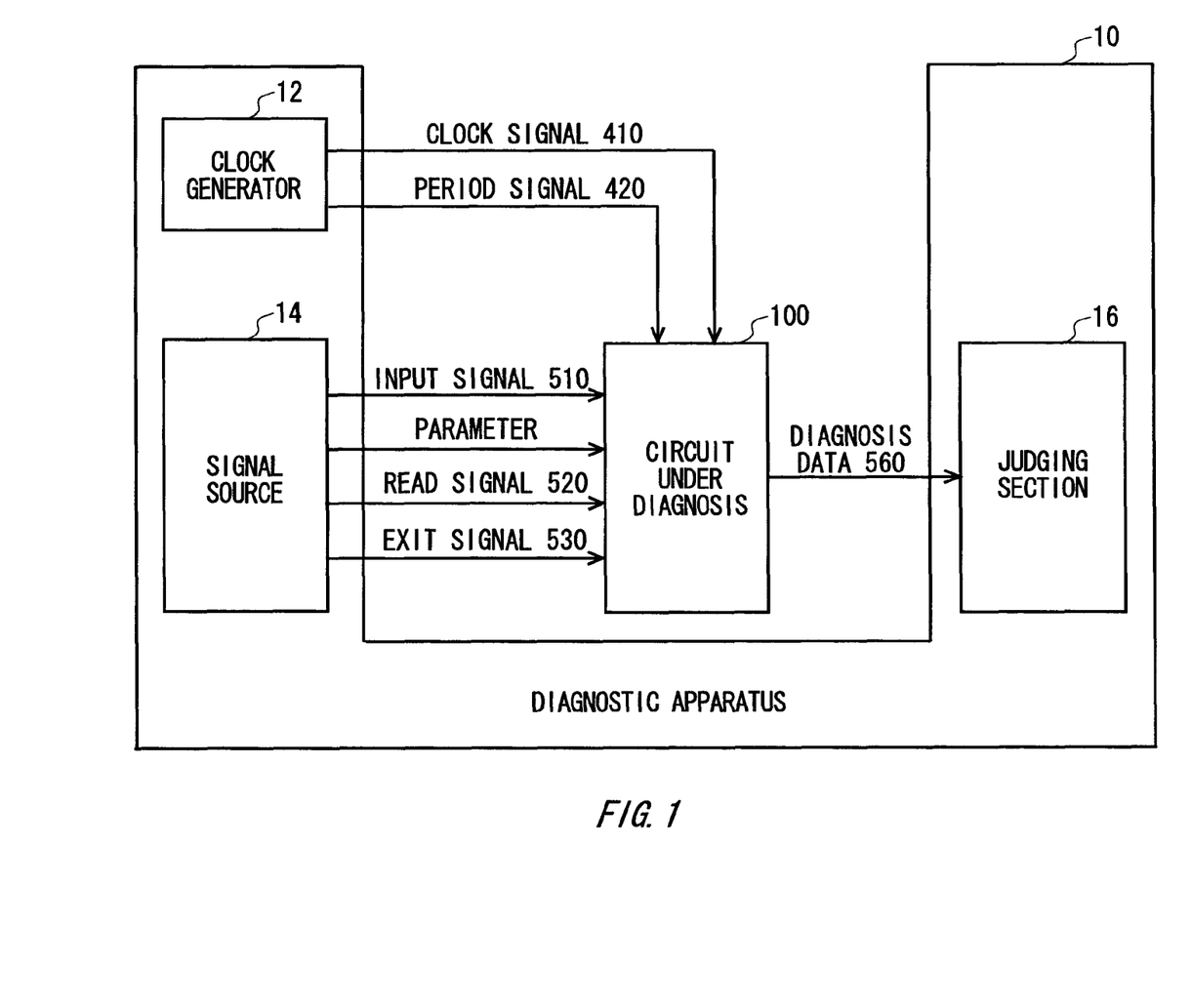
FIG. 1 illustrates the configuration of a diagnostic apparatus 10 relating to an embodiment of the present invention, together with a circuit under diagnosis 100.

FIG. 1 illustrates the configuration of a diagnostic apparatus 10 relating to an embodiment of the present invention, together with a circuit under diagnosis 100. The circuit under diagnosis 100 is a clock-synchronized circuit included in an electric device such as a semiconductor device and a circuit board. The circuit under diagnosis 100 operates in accordance with a signal supplied thereto from outside and outputs an output signal representing the result of the operation.

The diagnostic apparatus 10 diagnoses the above-described circuit under diagnosis 100. For example, the diagnostic apparatus 10 and the circuit under diagnosis 100 may be mounted on the same semiconductor device or substrate. For example, the circuit under diagnosis 100 may be a timing generator included in a semiconductor test apparatus. For example, the diagnostic apparatus 10 may be a self-diagnosis apparatus included in a semiconductor test apparatus.

The diagnostic apparatus 10 includes a clock generator 12, a signal source 14, and a judging section 16. The clock generator 12 supplies clock signals 410 to the circuit under diagnosis 100.

In the present embodiment, the clock generator 12 also supplies period signals 420 to the circuit under diagnosis 100. The period signals 420 designate a reference operation cycle. For example, the period signals 420 may be rate signals that designate the test cycle of a semiconductor test apparatus. The circuit under diagnosis 100 operates with reference to the clock signals 410 and the period signals 420. The clock generator 12 may be alternatively provided in the circuit under diagnosis 100.

The signal source 14 supplies to the circuit under diagnosis 100 an input signal 510 to diagnose the circuit under diagnosis 100 to perform a diagnosis process. The circuit under diagnosis 100 operates in accordance with the input signal 510 input thereto.

In the present embodiment, the signal source 14 supplies to the circuit under diagnosis 100 parameters that designate a diagnosis timing, before a diagnosis process starts. For example, the parameters may include a value designating a to-be-diagnosed circuit in the circuit under diagnosis 100, the count of period signals 420 from a reference timing, and the count of clock signals 410 from the timing at which a certain period signal 420 is generated. When the diagnosis timing designated by the parameters is reached after the circuit under diagnosis 100 starts operating in response to the input signal 510 input thereto, the circuit under diagnosis 100 enters into a hold state in which the to-be-diagnosed circuit (such as a clock-synchronized flip-flop and register) holds therein the output value (one- or multi-bit data) for a certain period of time. While the to-be-diagnosed circuit holds the output value therein for a certain period of time, the clock signals 410 and the period signals 420 are not suspended and continue to be supplied to the circuit under diagnosis 100. Therefore, no change is seen in the power supply current of the circuit under diagnosis 100.

According to the present embodiment, while the circuit under diagnosis 100 holds therein the output value output at the diagnosis timing, the signal source 14 supplies to the circuit under diagnosis 100 a read signal 520 that designates a timing at which the output value is read. In response to the reception of the read signal 520, the circuit under diagnosis 100 outputs the output value of the to-be-diagnosed circuit that is being held therein, as diagnosis data 560.

In the present embodiment, the signal source 14 supplies to the circuit under diagnosis 100 an exit signal 530 to allow the circuit under diagnosis 100 to exit from the hold state and restart operating. On reception of the exit signal 530, the circuit under diagnosis 100 exits the hold state and starts operating again.

The judging section 16 may cause an operator's monitor to display the diagnosis data 560 that is output from the circuit under diagnosis 100 in response to the input signal 510. The judging section 16 may judge whether the circuit under diagnosis 100 is acceptable based on the diagnosis data 560. In the present embodiment, the judging section 16 receives the diagnosis data 560 that is output from the circuit under diagnosis 100 on reception of the read signal 520. The judging section 16 judges whether the to-be-diagnosed circuit is acceptable based on a judgment as to whether the diagnosis data 560 matches expected value data.

Here, the expected value data used by the judging section 16 may be the data that is previously obtained from the to-be-diagnosed circuit while the to-be-diagnosed circuit correctly operates. When the diagnostic apparatus 10 repeatedly performs a plurality of diagnosis processes under the same condition, the judging section 16 may be adapted to judge whether a plurality of pieces of diagnosis data 560 match each other.

Figure 2:
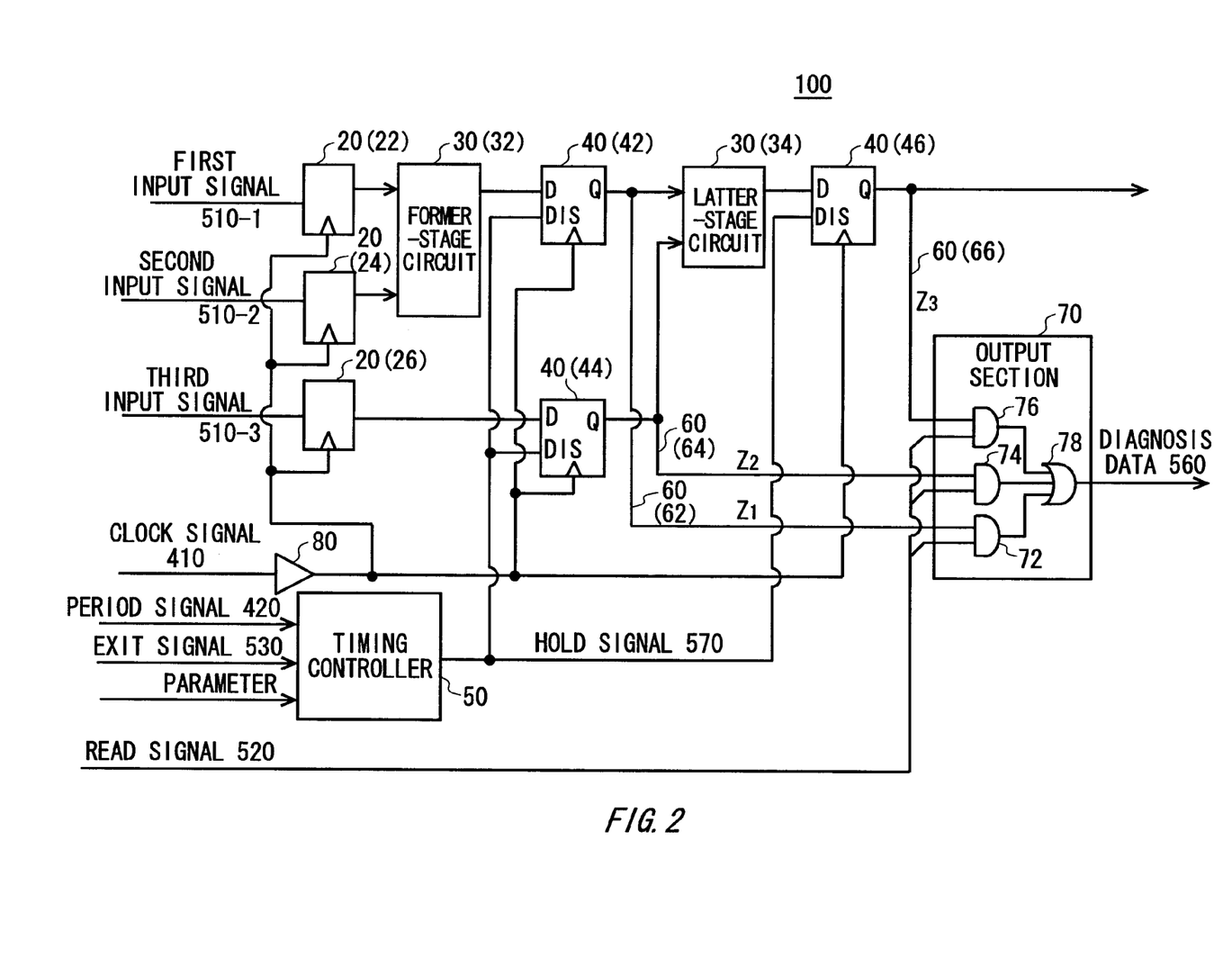
FIG. 2 illustrates in detail an exemplary configuration of the circuit under diagnosis 100 relating to the present embodiment.

FIG. 2 illustrates in detail an exemplary configuration of the circuit under diagnosis 100 relating to the present embodiment. The circuit under diagnosis 100 includes one or more clock-synchronized circuits that operate in accordance with the clock signals 410. The circuit under diagnosis 100 may additionally include one or more subordinate circuits connected to the clock-synchronized circuits.

In the present embodiment, the circuit under diagnosis 100 includes a plurality of input buffers 20, a plurality of circuits 30, a plurality of flip-flops 40, a timing controller 50, a plurality of diagnosis lines 60, an output section 70, and a clock buffer 80. For example, the input buffers 20 may include a first input buffer 22, a second input buffer 24, and a third input buffer 26. For example, the circuits 30 may include a former-stage circuit 32 and a latter-stage circuit 34. The flip-flops 40 may include a first flip-flop 42, a second flip-flop 44, and a third flip-flop 46.

The input buffers 20 retime the input signals 510. The input buffers 20 acquire the data values of the input signals 510 at the timing of the clock signal 410. The first input buffer 22 acquires the data value of a first input signal 510 at the timing of the clock signal 410. The second input buffer 24 acquires the data value of a second input signal 510 at the timing of the clock signal 410. The third input buffer 26 acquires the data value of a third input signal 510 at the timing of the clock signal 410.

The former-stage circuit 32 is provided between the input buffers 20 and the first flip-flop 42. The former-stage circuit 32 may be various processing circuits. The former-stage circuit 32 supplies to the first flip-flop 42 a signal with a propagation delay. The first flip-flop 42 receives from the former-stage circuit 32 the signal with a propagation delay, and retimes the received signal. Here, the received signal may not satisfy the setup and hold times of the first flip-flop 42 due to various factors such as the jitter of the clock signal 410, the temperature of the junction, the power supply voltage, and cross-talk noise with an adjacent circuit.

The latter-stage circuit 34 is provided between the third flip-flop 46 and the first and second flip-flops 42 and 44. The latter-stage circuit 34 may be various processing circuits. The latter-stage circuit 34 supplies to the third flip-flop 46 a signal with a propagation delay. Similarly to the first flip-flop 42, the received signal may not satisfy the setup and hold times of the third flip-flop 46. The third flip-flop 46 retimes the received signal and outputs the retimed signal to outside.

Each of the flip-flops 40 retimes the received signal. Specifically speaking, each flip-flop 40 acquires the data value of the signal input thereto in synchronization with a clock signal 410 and stores the acquired data value until receiving the next clock signal 410. Here, each flip-flop 40 has a disable terminal (DIS) to prohibit the flip-flop 40 from retiming the received signal and to allow the flip-flop 40 to keep the immediately preceding output state. When receiving a signal at the disable terminal, each flip-flop 40 enters into a clock disabled state in which the flip-flop 40 continues to store the acquired data value.

Configured in the above-described manner, each flip-flop 40 can hold its output state at the timing at which a signal is supplied to the disable terminal. Furthermore, the flip-flop 40 having the above-described configuration can continue to store therein the acquired data value irrespective of keeping receiving the clock signals 410 (in other words, does not require the clock signals 410 to be suspended in order to continue to store the acquired data value).

The timing controller 50 outputs a hold signal 570 to the disable terminal of each flip-flop 40 at the timing at which a circuit 30 associated with the flip-flop 40 is desired to be diagnosed. The timing controller 50 may output a hold signal 570 to each flip-flop 40 at an independent timing.

In the present embodiment, the timing controller 50 includes therein a period signal counter (not shown) and a clock signal counter (not shown). The timing controller 50 starts counting the clock signals 410 and the period signals 420 at a predetermined reference timing (not shown). The timing controller 50 may treat, as the reference timing, the timing at which the first input signal 510 is input into the circuit under diagnosis 100 from the signal source 14. Alternatively, the timing controller 50 may treat, as the reference timing, the timing designated by one of the input signals 510 output from the signal source 14. The clock signal counter and the period signal counter of the timing controller 50 may have different conditions as to when the timing controller 50 outputs the hold signal 570 depending on the operation modes.

The clock signal counter in the timing controller 50 increments the count in response to each clock signal and resets the count in response to each period signal. The period signal counter in the timing controller 50 increments the count in response to each period signal 420. When the count of the clock signals 410 and the count of the period signals 420 respectively match a period signal parameter and a clock signal parameter, which are supplied to the timing controller from an external device, the timing controller 50 outputs a hold signal 570 to a selected flip-flop 40.

The timing controller 50 may output the hold signal 570 when satisfying different conditions set depending on the operational modes. The timing controller 50 may include a plurality of clock signal counters and a plurality of period signal counters in a one-to-one correspondence with a plurality of hold signals 570 to be generated.

The timing controller 50 can trigger the flip-flops 40 (the first, second and third flip-flops 42, 44 and 46) into the clock disabled state, by outputting the hold signal 570. Here, the timing controller 50 may output hold signals 570 at independent timings to the respective flip-flops 40. Thus, the circuit under diagnosis 100 enters into the hold state in which the output values output from the circuits 30 at the respective diagnosis timings are stored therein. Accordingly, the judging section 16 can read the diagnosis data 560.

In the present embodiment, the timing controller 50 stops outputting the hold signal 570 in response to the exit signal 530, so that the circuit under diagnosis 100 exits the hold state. The timing controller 50 can allow the flip-flops 40 (the first, second and third flip-flops 42, 44 and 46) to exit the clock disabled state, by stopping outputting the hold signals 570. Stated differently, the timing controller 50 can allow the flip-flops 40 to restart acquiring the data values of the signals output from the circuits 30 in synchronization with the clock signal 410, by stopping outputting the hold signals 570. Accordingly, the circuit under diagnosis 100 exits the hold state and restarts operating normally.

The plurality of diagnosis lines 60 are respectively provided in correspondence with the plurality of flip-flops 40. Each diagnosis line 60 outputs the data value stored in the corresponding flip-flop 40, as the diagnosis data 560.

In the present embodiment, the plurality of diagnosis lines 60 may include a first diagnosis line 62, a second diagnosis line 64, and a third diagnosis line 66, for example. The first diagnosis line 62 corresponds to the first flip-flop 42, and outputs the data value (Z1) stored in the first flip-flop 42 as the diagnosis data 560. The second diagnosis line 64 corresponds to the second flip-flop 44, and outputs the data value (Z2) stored in the second flip-flop 44 as the diagnosis data 560. The third diagnosis line 66 corresponds to the third flip-flop 46, and outputs the data value (Z3) stored in the third flip-flop 46 as the diagnosis data 560.

The output section 70 sends, to the judging section 16 of the diagnostic apparatus 10, the diagnosis data 560 output through the diagnosis lines 60. In the present embodiment, at the timing designated by the read signal 520, the output section 70 selects the data value output from the to-be-diagnosed circuit 30 that is designated by the read signal 520, and sends the selected data value to the judging section 16 as the diagnosis data 560.

For example, the output section 70 may include a first mask circuit 72, a second mask circuit 74, a third mask circuit 76, and a combiner circuit 78. The first mask circuit 72 corresponds to the first flip-flop 42. The first mask circuit 72 passes therethrough the data value output via the first diagnosis line 62 from the first flip-flop 42 when the read signal 520 designates the first flip-flop 42, but does not allow the data value to pass therethrough in other cases.

The second mask circuit 74 corresponds to the second flip-flop 44. The second mask circuit 74 passes therethrough the data value output via the second diagnosis line 64 from the second flip-flop 44 when the read signal 520 designates the second flip-flop 44, but does not allow the data value to pass therethrough in other cases. The third mask circuit 76 corresponds to the third flip-flop 46. The third mask circuit 76 passes therethrough the data value output via the third diagnosis line 66 from the third flip-flop 46 when the read signal 520 designates the third flip-flop 46, but does not allow the data value to pass therethrough in other cases. The combiner circuit 78 sends the data values that has passed through the first, second and third mask circuits 72, 74 and 76, to the judging section 16 as the diagnosis data 560.

For example, the output section 70 may receive 1- to 16-bit data from the flip-flops 40 and send the received data to the judging section 16. The first, second and third mask circuits 72, 74, and 76 are preferably positioned in the vicinity of the output ends of the respective flip-flops 40 so as not to damage the high-speed operation of the flip-flops 40.

The clock buffer 80 amplifies the clock signals 410 to be supplied to the input buffers 20 and the flip-flops 40. In the present embodiment, the clock buffer 80 buffers therein the clock signals 410 supplied thereto from outside and delivers the clock signals 410 to the first, second and third flip-flops 42, 44 and 46.

Alternatively to the above-described configuration, the timing controller 50 may output the hold signal 570 to one of the flip-flops 40 that acquires the data value to be diagnosed. Stated differently, the timing controller 50 may not need to output the hold signal 570 to the flip-flops 40 that are not to be diagnosed. When this alternative configuration is implemented, the output section 70 selects one of the diagnosis lines 60 that corresponds to the flip-flop 40 that has received the hold signal 570, and outputs to outside the data value stored in the flip-flop 40 at the timing at which the corresponding circuit 30 is diagnosed.

Figure 3:
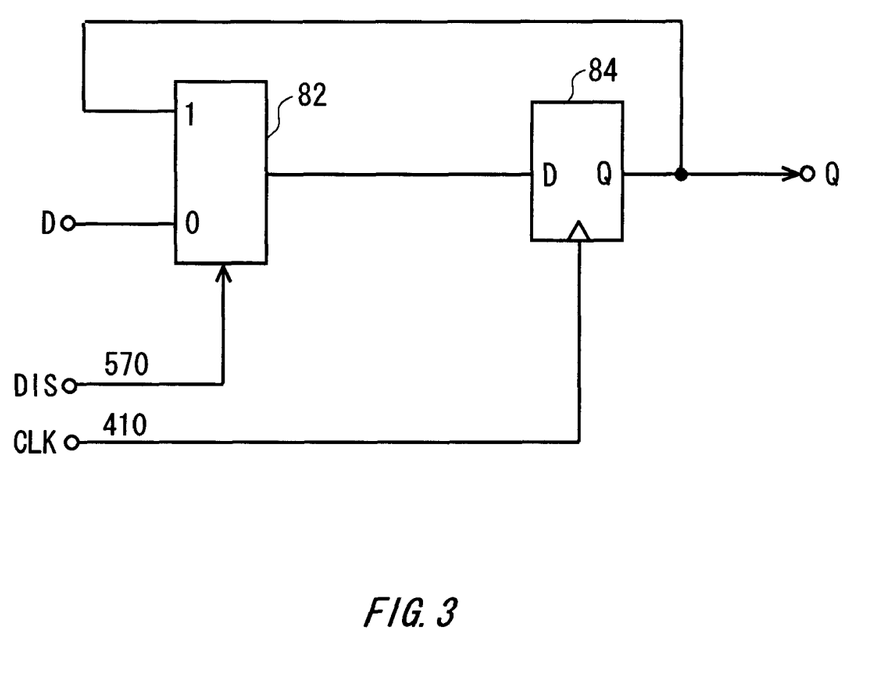
FIG. 3 illustrates an exemplary configuration of a flip-flop 40.

FIG. 3 illustrates an exemplary configuration of each flip-flop 40. The flip-flops 40 may each include a selector 82 and a latch 84, for example.

The selector 82 selects and outputs the signal supplied to the input terminal of the flip-flop 40, while the hold signal 570 is supplied to the disable terminal (DIS). The selector 82 selects and outputs the signal output from the latch 84 (in other words, the signal stored in the latch 84), while the hold signal 570 is not supplied to the disable terminal (DIS).

The latch 84 acquires, in synchronization with a clock signal 410, the data value of the signal selected and output by the selector 82, and stores the acquired data value until receiving the next clock signal 410. The latch 84 outputs the stored data value from the output terminal of the flip-flop 40.

Configured in the above-described manner, each flip-flop 40 can acquire the data value of the signal supplied to the input terminal thereof in synchronization with a clock signal 410 and can store the acquired data value until receiving the next clock signal 410, while a signal is not supplied to the disable terminal. On the other hand, each flip-flop 40 can continue to store the acquired data value in spite of keeping receiving clock signals 410 after the next clock signal 410, while a signal is supplied to the disable terminal.

Figure 4:
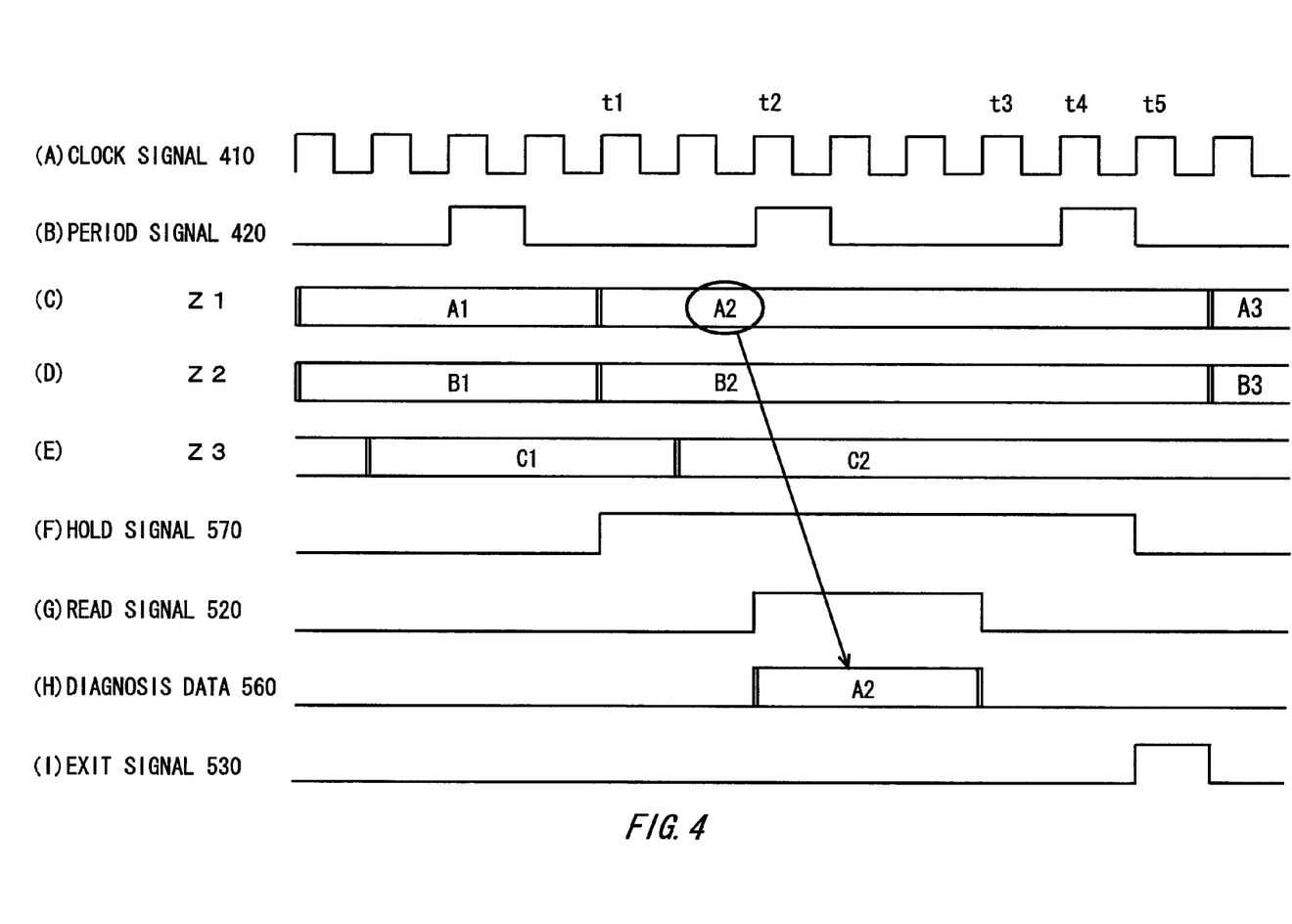
FIG. 4 illustrates, as an example, various signals supplied to the circuit under diagnosis 100.

FIG. 4 illustrates, as an example, the respective signals sent to the circuit under diagnosis 100. In FIG. 4, (A) represents the clock signals 410, (B) represents the period signals 420, (C) represents the data value (Z1) stored in the first flip-flop 42, and (D) represents the data value (Z2) stored in the second flip-flop 44.

In FIG. 4, (E) represents the data value (Z3) stored in the third flip-flop 46, (F) represents the hold signal 570, (G) represents the read signal 520, (H) represents the diagnosis data 560, and (I) represents the exit signal 530.

Before starting a diagnosis process, the diagnostic apparatus 10 supplies to the circuit under diagnosis 100 parameters that determine when and to which flip-flop 40 the hold signal 570 is output. Subsequently, the diagnostic apparatus 10 supplies the input signal 510 to the circuit under diagnosis 100 to cause the circuit under diagnosis 100 to operate in a diagnosis mode. The timing controller 50 of the circuit under diagnosis 100 starts counting the period signals 420 and the clock signals 410 at a predetermined reference timing, after the circuit under diagnosis 100 starts operating in the diagnosis mode. The timing controller 50 outputs the hold signal 570 at a diagnosis timing or when the counts match the parameters (time t1).

The hold signal 570 is supplied to at least one of the flip-flops 40, which enters into the clock disabled state. Accordingly, after the time t1, the flip-flop 40 continues to store therein the data value that is output from the corresponding circuit 30 at the diagnosis timing (t1). The circuit under diagnosis 100 thus enters into and remains in the hold state irrespective of keeping receiving the clock signals 410.

Subsequently, the diagnostic apparatus 10 supplies the read signal 520 to the circuit under diagnosis 100 (from the time t2 to the time t3). On reception of the read signal 520, the output section 70 selects one of the flip-flops 40 that corresponds to the circuit 30 to be diagnosed that is designated by the read signal 520, and outputs the data value stored in the selected flip-flop 40 as the diagnosis data 560. In the example shown in FIG. 4, the output section 70 outputs the data value (A2) stored in the first flip-flop 42 as the diagnosis data 560. Here, the output section 70 may not be configured to select one of the data values stored in the flip-flops 40 and output the selected data value as the diagnosis data 560. Alternatively, the output section 70 may output the data values stored in the flip-flops 40 as the diagnosis data 560.

After receiving the diagnosis data 560 from the circuit under diagnosis 100, the diagnostic apparatus 10 supplies the exit signal 530 to the circuit under diagnosis 100 (time t4). On reception of the exit signal 530, the timing controller 50 stops outputting the hold signal 570 (time t5). Since the flip-flops 40 no longer receives the hold signal 570, the flip-flops 40 exit the clock disabled state. Accordingly, the circuit under diagnosis 100 starts operating again.

The circuit under diagnosis 100 configured in the above-described manner does not require the clock signals 410 to be suspended to hold the output value that is output from the circuit 30 to be diagnosed at a given timing and to supply the held value to the diagnostic apparatus 10. Since the clock signals 410 are continuously supplied to the circuit under diagnosis 100, no change is seen in the power consumed by the clock buffer 80 and the flip-flops 40 of the circuit under diagnosis 100. Accordingly, no transient change is seen in the power supply voltage, and the circuit under diagnosis 100 can thus operate during a diagnosis process performed by the diagnostic apparatus 10 under the same conditions as during an actual operation. As a result, the diagnostic apparatus 10 can diagnose the circuit under diagnosis 100 based on stable data.

Since the circuit under diagnosis 100 can output the diagnosis data without requiring the clock signals 410 to be suspended, the power supply load of the circuit under diagnosis 100 only experiences a small change when the circuit under diagnosis 100 transits from the operative state to the hold state and from the hold state to the operative state. Accordingly, when the diagnostic apparatus 10 successively performs a plurality of diagnosis processes on the circuit under diagnosis 100, no time interval is required between the diagnosis processes to deal with the varying power supply load. As a result, the diagnostic apparatus 10 can complete the diagnosis processes of the circuit under diagnosis 100 within a shorter period of time.

Figure 5:
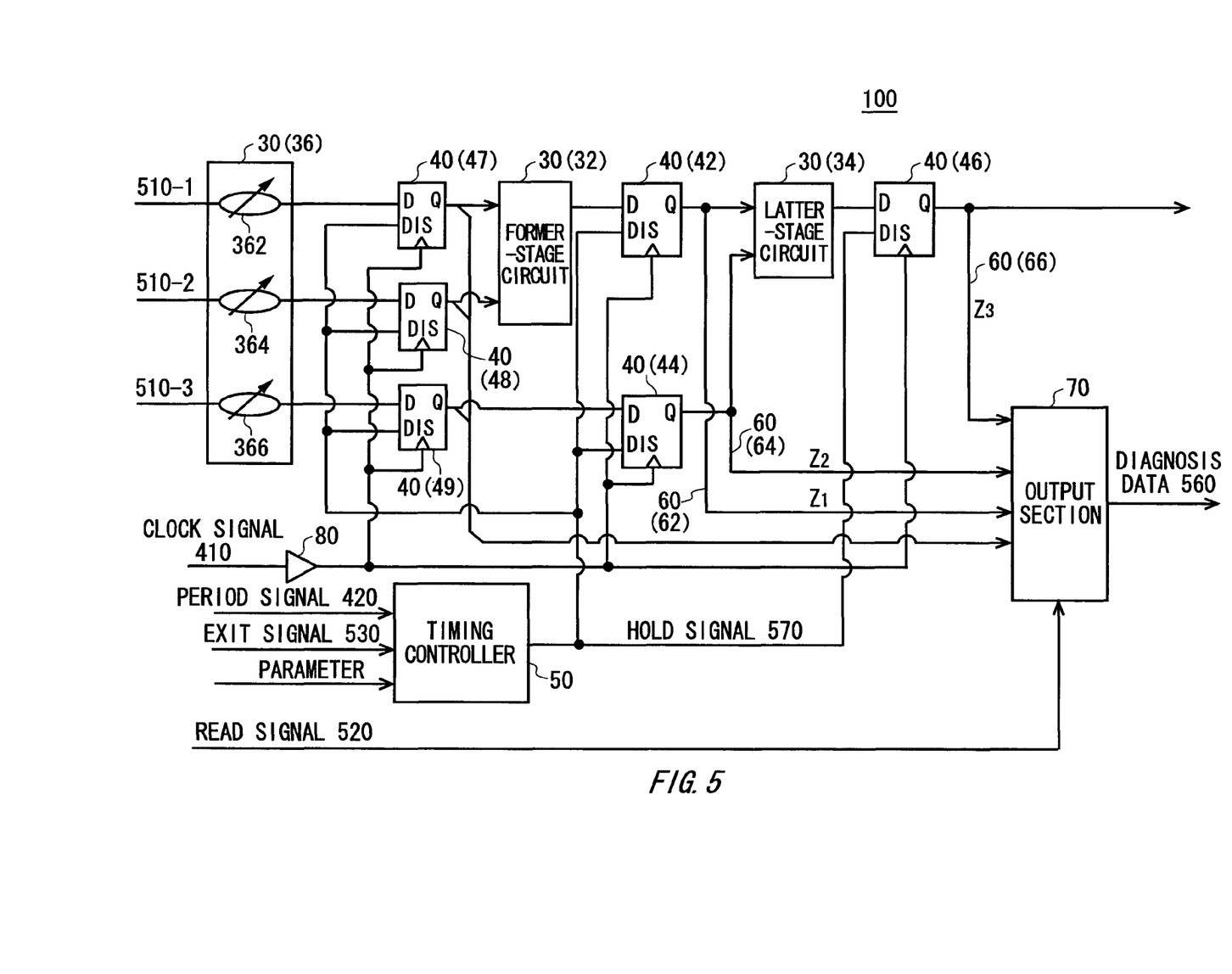
FIG. 5 illustrates in detail an exemplary configuration of a circuit under diagnosis 100 relating to a first modification example of the present embodiment.

FIG. 5 illustrates in detail an exemplary configuration of a circuit under diagnosis 100 relating to a first modification example of the present embodiment. The circuit under diagnosis 100 relating to the first modification example has substantially the same configurations and functions as the circuit under diagnosis 100 shown in FIG. 2. Therefore, the constituents having substantially the same configurations and functions as the corresponding constituents of the circuit under diagnosis 100 shown in FIG. 2 are assigned with the same reference numerals as in FIG. 2. The following description will be made with a focus on the differences between the first modification example and the previously described embodiment.

The circuit under diagnosis 100 may include a margin adjusting circuit 36 to adjust a time margin that is provided to enable the circuit under diagnosis 100 to reliably exchange data with a different electric device. The margin adjusting circuit 36 is one of the circuits 30, for example. The margin adjusting circuit 36 may include a first variable delay element 362 for delaying the first input signal 510-1, a second variable delay element 364 for delaying the second input signal 510-2 and a third variable delay element 366 for delaying the third input signal 510-3, for example.

In the circuit under diagnosis 100 relating to the first modification example, the following stage of the margin adjusting circuit 36 is constituted by flip-flops 40, in place of the input buffers 20. Stated differently, the circuit under diagnosis 100 relating to the first modification example includes a fourth flip-flop 47, a fifth flip-flop 48, and a sixth flip-flop 49, in place of the first input buffer 22, the second input buffer 24, and the third input buffer 26.

In the first modification example, the diagnostic apparatus 10 may detect the shortest time margin that enables the flip-flops 40 (the fourth, fifth, and sixth flip-flops 47, 48 and 49) positioned as the following stage of the margin adjusting circuit 36 to acquire correct output values, while causing the margin adjusting circuit 36 to sequentially vary the time margin. Here, the diagnostic apparatus 10 can cause the circuit under diagnosis 100 to operate during the above-described time margin detection process under the same conditions as during an actual operation. As a result, the diagnostic apparatus 10 can detect an accurate time margin.

The diagnostic apparatus 10 may further include a power supply voltage varying device (not shown). The diagnostic apparatus 10 may use the power supply voltage varying device to perform a test to detect a margin for the variation of the power supply voltage of the circuit under diagnosis 100. The diagnostic apparatus 10 may detect one of the circuits included in the circuit under diagnosis 100 that has the smallest margin for the power supply voltage variation, for example.

The power supply voltage varying device varies the power supply voltage that is supplied to all the constituents of the circuit under diagnosis 100. For example, the power supply voltage varying device can vary the power supply voltage by approximately +−10%.

The diagnostic apparatus 10 uses the power supply voltage varying device to vary the power supply voltage in steps or continuously, and acquires the output value of the to-be-diagnosed flip-flop 40 in association with each level of the power supply voltage under the same test conditions and judge whether the flip-flop 40 is acceptable. For example, the diagnostic apparatus 10 may sequentially vary the level of the power supply voltage in such a manner that the circuit under diagnosis 100 finally malfunctions as a result of the variation (for example, the diagnostic apparatus 10 may lower the power supply voltage). The diagnostic apparatus 10 may treat, as a correct value, the output value of the to-be-diagnosed flip-flop 40 that is output when a correct power supply voltage is supplied to the circuit under diagnosis 100, and judge that the to-be-diagnosed flip-flop 40 is defective when the acquired output value is different from the correct value. The diagnostic apparatus 10 measures the margin of the to-be-diagnosed flip-flop 40 for the power supply voltage by detecting the highest or lowest power supply voltage that enables the to-be-diagnosed flip-flop 40 to produce the correct output value.

When the power supply voltage is sequentially varied, the plurality of flip-flops 40 start malfunctioning at different timings in the circuit under diagnosis 100. The diagnostic apparatus 10 may detect which one of the flip-flops 40 first starts malfunctioning. In this manner, the diagnostic apparatus 10 can detect which one of the circuits included in the circuit under diagnosis 100 has the smallest margin for the variation of the power supply voltage.

The diagnostic apparatus 10 may sequentially vary a test condition and measure the margin of the to-be-diagnosed flip-flop 40 for the test condition. For example, the diagnostic apparatus 10 may sequentially vary the input signal 510 supplied from the signal source 14 to the circuit under diagnosis 100 to measure the margin of the to-be-diagnosed flip-flop 40 for the test condition.

Here, the diagnostic apparatus 10 may similarly detect which one of the circuits has the smallest margin for the variation of the test condition. Furthermore, the diagnostic apparatus 10 may detect what test condition or logical state produces a small margin. In this manner, the diagnostic apparatus 10 can identify causes of the intermittent malfunctions in the circuit under diagnosis 100, thereby improving the reliability of the circuit under diagnosis 100.

Figure 6:
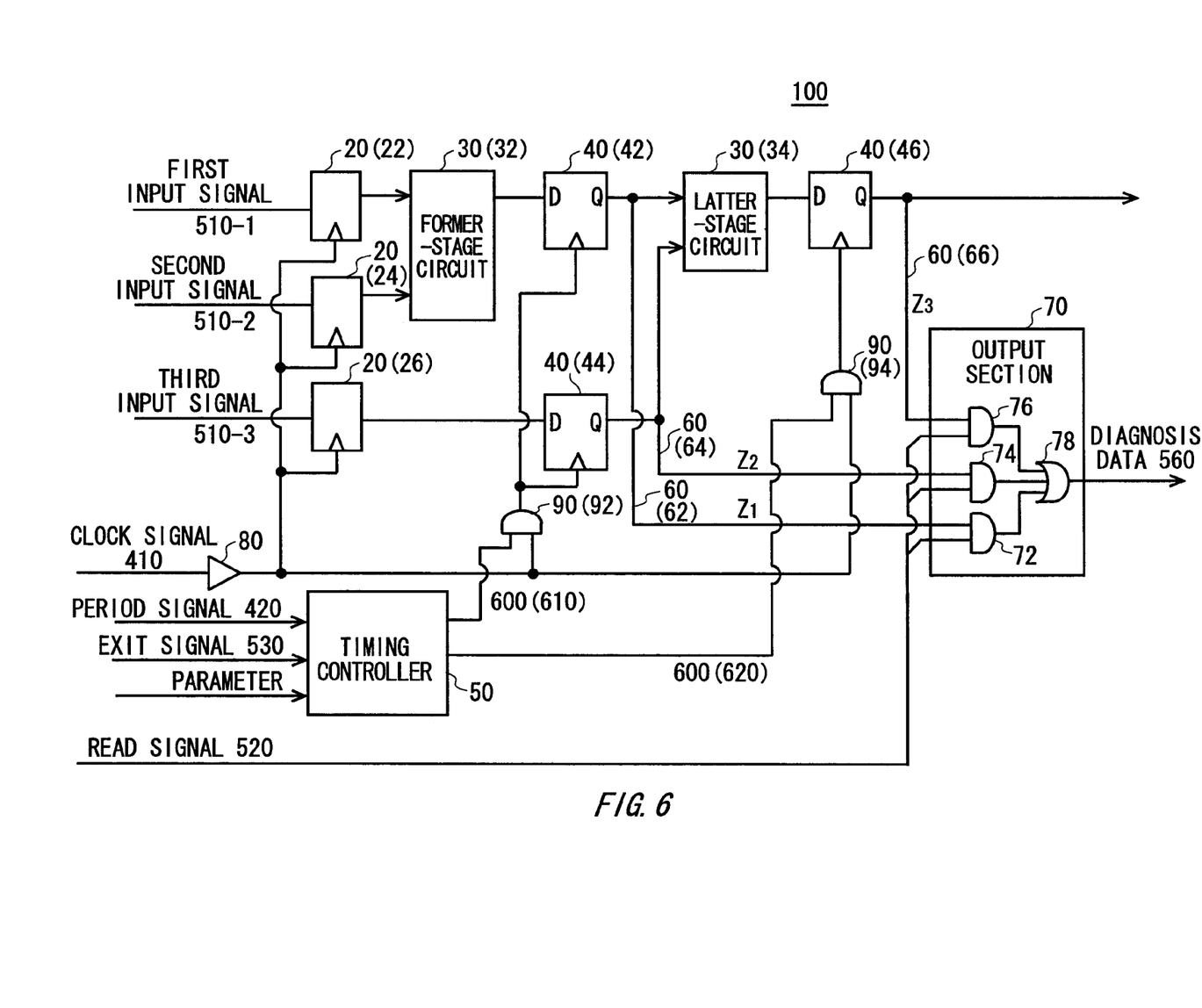
FIG. 6 illustrates in detail an exemplary configuration of a circuit under diagnosis 100 relating to a second modification example of the present embodiment.

FIG. 6 illustrates in detail an exemplary configuration of a circuit under diagnosis 100 relating to a second modification example of the present embodiment. The circuit under diagnosis 100 relating to the second modification example has substantially the same configurations and functions as the circuit under diagnosis 100 shown in FIG. 2. Therefore, the constituents having substantially the same configurations and functions as the corresponding constituents of the circuit under diagnosis 100 shown in FIG. 2 are assigned with the same reference numerals as in FIG. 2. The following description will be made with a focus on the differences between the second modification example and the previously described embodiment.

According to the second modification example, the flip-flops 40 do not have a disable terminal. Also, the circuit under diagnosis 100 relating to the second modification example additionally includes a plurality of mask sections 90. The mask sections 90 are provided in correspondence with the flip-flops 40. Each mask section 90 masks the clock signal 410 that is to be directed to the corresponding flip-flop 40.

According to the second modification example, the mask sections 90 may include a first mask section 92 and a second mask section 94, for example. The first mask section 92 masks the clock signal 410 that is to be directed to the first flip-flop 42 and the second flip-flop 44. The second mask section 94 masks the clock signal 410 that is to be directed to the third flip-flop 46. Here, the mask sections 90 are preferably configured to stop the clock signals 410 in synchronization with the clock signals 410 supplied thereto.

According to the second modification example, the flip-flops 40 do not need a disable terminal (DIS). The flip-flops 40 can hold their output states when the clock signals 410 are prevented from being input into the flip-flops 40. In the second modification example, the power consumed by the circuit under diagnosis 100 decreases in proportion to the number of flip-flops 40 for which the input of the clock signals 410 is prevented. Such a decrease in the power consumption, however, is very small relative to the power consumption of the entire circuit under diagnosis 100. Stated differently, the variation in the power consumption of the circuit under diagnosis 100 can be controlled small enough not to practically cause problems.

In the second modification example, the timing controller 50 outputs a mask signal 600 to one of the mask sections 90 that corresponds to the to-be-diagnosed circuit 30 at the timing at which the to-be-diagnosed circuit 30 is diagnosed, to mask the clock signals 410 to be input into the flip-flop 40 corresponding to the to-be-diagnosed circuit 30. For example, the timing controller 50 may receive from the diagnostic apparatus 10 information designating one of the circuits 30 that is to be diagnosed and select the mask section 90 corresponding to the to-be-diagnosed circuit 30 based on the received information. The timing controller 50 may output to the selected mask section 90 the mask signal 600 at the timing at which the to-be-diagnosed circuit 30 is desired to be diagnosed.

According to the second modification example, the mask signal 600 may include a former-stage mask signal 610 to cause the first mask section 92 to mask the clock signals 410 and a latter-stage mask signal 620 to cause the second mask section 94 to mask the clock signals 410. When the former-stage circuit 32 is desired to be diagnosed, the timing controller 50 outputs the former-stage mask signal 610 at the diagnosis timing. When the latter-stage circuit 34 is desired to be diagnosed, the timing controller 50 outputs the latter-stage mask signal 620 at the diagnosis timing.

By outputting the mask signal 600, the timing controller 50 can suspend the to-be-diagnosed flip-flop 40 from acquitting the signal. Thus, the circuit under diagnosis 100 enters into the hold state in which the circuit under diagnosis 100 stores therein the output value that is output from the to-be-diagnosed circuit 30 at the diagnosis timing.

In the second modification example, the timing controller 50 stops outputting the mask signal 600 on reception of the exit signal 530. The timing controller 50 can allow the to-be-diagnosed flip-flop 40 to resume acquiring the signal, by stopping outputting the mask signal 600. Stated differently, by stopping outputting the mask signal 600, the timing controller 50 can allow the to-be-diagnosed flip-flop 40 to acquire the data value of the signal output from the corresponding circuit 30 in synchronization with the clock signal 410. As a result, the circuit under diagnosis 100 exits the hold state and starts operating again.

With the above-described configuration, the circuit under diagnosis 100 can provide the diagnostic apparatus 10 with the output value that is output from the to-be-diagnosed circuit 30 at a given timing, without requiring the clock signals 410 to be suspended from being supplied to one or more of the circuits 30 that are not to be diagnosed. As a result, the diagnostic apparatus 10 can cause the circuit under diagnosis 100 to operate during a diagnosis process under the same conditions as during an actual operation.

Accordingly, the diagnostic apparatus 10 relating to the second modification example can diagnose the circuit under diagnosis 100 based on stable data. In addition, the diagnostic apparatus 10 can complete diagnosing the circuit under diagnosis 100 within a shorter period of time. Furthermore, the diagnostic apparatus 10 can accurately measure, for the amount of buffered input/output data, a margin that enables the circuit under diagnosis 100 to reliably exchange data with a different circuit under diagnosis.

Although some aspects of the present invention have been described by way of exemplary embodiments, it should be understood that those skilled in the art might make many changes and substitutions without departing from the spirit and the scope of the present invention which is defined only by the appended claims.

What is claimed is:

1. An electric device comprising:
   a plurality of circuits that are operable in synchronization with a clock signal;
   a plurality of flip-flops each of which is capable of acquiring a data value of a signal from a corresponding one of the plurality of circuits in synchronization with the clock signal and storing the acquired data value therein until receiving a next clock signal, each flip-flop capable of entering into a clock-disabled state, when receiving a signal at a disable terminal thereof, in which the acquired data value continues to be stored in the flip-flop after receiving the next clock signal;
   a timing controller that is capable of outputting a hold signal to the disable terminal of each flip-flop at a timing at which a corresponding circuit is desired to be diagnosed; and
   a plurality of diagnosis lines that are respectively provided in correspondence with the plurality of flip-flops, each diagnosis line being capable of outputting as diagnosis data a data value stored in a corresponding flip-flop.

2. The electric device as set forth in claim 1, wherein
   the timing controller outputs a hold signal to one of the plurality of flip-flops that acquires a data value to be diagnosed, and
   the electric device further comprises
   an output section that is capable of selecting one of the plurality of diagnosis lines that corresponds to the flip-flop to which the hold signal is supplied and outputting to outside a data value that is stored into the flip-flop at a timing at which a corresponding circuit is desired to be diagnosed.

3. A diagnostic apparatus for diagnosing the electric device as set forth in claim 1, the diagnostic apparatus comprising:
   a signal source that is capable of supplying to the electric device an input signal to diagnose the electric device; and
   a judging section that is capable of judging whether the electric device is acceptable based on diagnosis data that is output from the electric device in response to the input signal.

4. The electric device as set forth in claim 1, further comprising:
   a clock buffer that is capable of amplifying the clock signal and supplying the clock signal to the plurality of circuits and the plurality of flip-flops.

5. The electric device as set forth in claim 1, wherein
   the clock signal is continuously supplied to the electric device without being suspended for diagnosis.

6. An electric device comprising:
   a plurality of circuits that are operable in synchronization with a clock signal;
   a plurality of flip-flops each of which is capable of acquiring a data value of a signal from a corresponding one of the plurality of circuits in synchronization with the clock signal and storing the acquired data value therein until receiving a next clock signal;
   a plurality of mask sections that are provided in correspondence with the plurality of flip-flops, each mask section being capable of masking the clock signal to be input into a corresponding one of the plurality of flip-flops;

a timing controller that is capable of outputting a mask signal to one of the plurality of mask sections that corresponds to a circuit to be diagnosed at a timing at which the circuit is desired to be diagnosed so that the mask section masks the clock signal to be input into a flip-flop corresponding to the circuit to be diagnosed; and a plurality of diagnosis lines that are respectively provided in correspondence with the plurality of flip-flops, each diagnosis line being capable of outputting as diagnosis data a data value stored in a corresponding flip-flop.

7. A diagnostic apparatus for diagnosing the electric device as set forth in claim 6, the diagnostic apparatus comprising:

a signal source that is capable of supplying to the electric device an input signal to diagnose the electric device; and a judging section that is capable of judging whether the electric device is acceptable based on diagnosis data that is output from the electric device in response to the input signal.

8. The electric device as set forth in claim 6, further comprising:

a clock buffer that is capable of amplifying the clock signal and supplying the clock signal to the plurality of circuits and the plurality of flip-flops.

9. The electric device as set forth in claim 6, wherein the clock signal is continuously supplied to the electric device without being suspended for diagnosis from one or more circuits that are not to be diagnosed.

* * * * *